(12) United States Patent
Tiwari et al.

(10) Patent No.: US 8,553,455 B2
(45) Date of Patent: Oct. 8, 2013

(54) SHAPE MEMORY DEVICE

(75) Inventors: Sandip Tiwari, Ithaca, NY (US); Chung Woo Kim, Suwon-si (KR)

(73) Assignees: Cornell Research Foundation, Inc., Ithaca, NY (US); Samsung Electronics Co., Ltd., Gyeonggi-do (KR)

( * ) Notice: Subject to any disclaimer, the term of this patent is extended or adjusted under 35 U.S.C. 154(b) by 1090 days.

(21) Appl. No.: 11/528,712

(22) Filed: Sep. 27, 2006

(65) Prior Publication Data

US 2007/0086237 A1    Apr. 19, 2007

Related U.S. Application Data

(60) Provisional application No. 60/721,150, filed on Sep. 27, 2005.

(51) Int. Cl.
*G11C 11/34* (2006.01)

(52) U.S. Cl.
USPC .......................................................... 365/174

(58) Field of Classification Search
USPC .......................................................... 365/174
See application file for complete search history.

(56) References Cited

U.S. PATENT DOCUMENTS

| | | | | |
|---|---|---|---|---|
| 4,812,888 A * | 3/1989 | Blackburn | | 257/254 |
| 4,979,149 A * | 12/1990 | Popovic et al. | | 365/244 |
| 6,625,047 B2 | 9/2003 | Coleman, Jr. | | |
| 7,061,660 B1 * | 6/2006 | Chen et al. | | 359/238 |
| 7,161,218 B2 * | 1/2007 | Bertin et al. | | 257/415 |
| 2002/0097136 A1 | 7/2002 | Coleman, Jr. et al. | | |
| 2002/0153583 A1 | 10/2002 | Frazier et al. | | |
| 2003/0155932 A1 * | 8/2003 | Staple et al. | | 324/525 |
| 2005/0037547 A1 | 2/2005 | Bertin et al. | | |

FOREIGN PATENT DOCUMENTS

| KR | 1020040108760 A | 10/2004 |
|---|---|---|
| WO | WO-2007/038558 A2 | 4/2007 |
| WO | WO-2007038558 A3 | 4/2007 |

OTHER PUBLICATIONS

"Chinese Application Serial No. 200680035573.1, Office Action issued May 8, 2009", 5 pgs.
"Korean Application Serial No. 10-2006-0094446, Office Action dated Mar. 13, 2009", 5 pgs.
"International Search Report for corresponding PCT Application No. PCT/US2006/037582", (May 30, 2007), 6 pgs.
"Written Opinion of the International Searching Authority for corresponding PCT Application No. PCT/US2006/037582", (May 30, 2007), 17 pgs.
Avci, U., et al., "Back-Floating Gate Non-Volatile Memory", *2004 IEEE International SOI Conference*, (2004), 133-135.

(Continued)

*Primary Examiner* — Tran Tran
(74) *Attorney, Agent, or Firm* — Perkins Coie LLP

(57) ABSTRACT

Mechanical devices having bistable positions are utilized to form switches and memory devices. The devices are actuatable to different positions and may be coupled to a transistor device in various configurations to provide memory devices. Actuation mechanisms include electrostatic methods and heat. In one form, the mechanical device forms a gate for a field effect transistor. In a further form, the device may be a switch that may be coupled to the transistor in various manners to affect its electrical characteristics when on and off. The memory switch in one embodiment comprises side walls formed with tensile or compressive films. A cross point switch is formed from a plurality of intersecting conductive rows and columns of conductors. Actuatable switches are positioned between each intersection of the rows and columns such that each intersection is independently addressable.

24 Claims, 17 Drawing Sheets

(56) References Cited

OTHER PUBLICATIONS

Baughman, R. H., "Conducting Polymer Artificial Muscles", *Synthetic Metals*, 78, (1996), 339-353.

Chavy, C., et al., "Interpretation of STM Images: $C_{60}$ on the Gold(110) Surface", *Chemical Physics Letters*, 214(6), (1993), 569-575.

Credi, A., et al., "From Supramolecular Electrochemistry to Molecular-Level Devices", *Electrochimica Acta*, 49, (2004), 3865-3872.

Dietrich-Buchecker, C., et al., "Rotaxanes and Catenanes as Prototypes of Molecular Machines and Motors", *Pure Appl. Chem.*, 75(10), (2003), 1383-1393.

Newton, S. P., et al., "Self-Assembled Macromolecular and Macrosupramolecular Systems", *Supramolecular Science*, 3(4), (Dec. 1996), 221-236.

\* cited by examiner

SHAPE MEMORY DEVICE

RELATED APPLICATION

This application claims priority to United States Provisional Application Ser. No. 60/721,150 (entitled MEMORY DEVICE, filed Sep. 27, 2005) which is incorporated herein by reference.

GOVERNMENT FUNDING

This invention was made with Government support under OSP Number 46108/A001 awarded by the National Program for Tera-Level Nanodevices. The United States Government has certain rights in the invention.

BACKGROUND

Non-volatile memories are ubiquitous. They are used in digital cameras, cell phones, music players, computers, and many other devices where non-volatile retention with rapid reading is of interest. Semiconductor non-volatile memories provide speeds which while slower than of SRAMs, are faster than possible through other means, e.g., magnetic disks.

The most common forms of non-volatile memory are various manifestations of electrically erasable and programmable memory structures employing a floating gate region in which charge is stored. Many new manifestations of this structure use few electrons, single electrons, and defects to lower the power and to allow scaling to dimensions lower than those possible with continuous floating gate regions. Memories have also employed defects and storage on the back of a silicon channel, thus allowing simultaneous transistor and memory capabilities.

Ultimately, as all these approaches employ electrons and holes for storage, the scalability is constrained by the number of electrons and the reliability issues arising from leakage of carriers and generation of defects during injection and extraction. A reliable low power memory device that can be scaled to transistor's ultimate limit near 10 nm and that can have high endurance and high speed is highly desirable.

In order to achieve memory function, one needs two quasi-stable states. In electronic silicon non-volatile memories, the quasi-stable states are achieved by storing charge on a continuous or discrete floating gate region surrounded barrier regions made of silicon dioxide and/or other dielectrics that prevent leakage of stored charge. The presence or absence of this charge is measured through the operation of a transistor whose threshold voltage is affected by the stored charge. A non-volatile memory is usually implemented with two stable states, but more are possible depending on the ability to achieve distinction between reproducible stored charge number, as also in the location of the charge, e.g., between the source-end region and drain-end region of a transistor. Thus, these nonvolatile memories depend on electron transport phenomena—both in the transistor which is the reading and writing medium and the floating gate region.

There are additional approaches. One group of approaches aims to achieve non-volatile memory where a transistor is coupled to an additional passive element-a ferroelectric element where polarization is changed, or a phase change element where the resistance of a conducting element is changed. These elements operate by changing the conductivity in the high to low potential path of a cell.

Many new manifestations of the floating gate structure based memories use few electrons, single electrons, and defects to lower the power and to allow scaling of dimensions to dimensions lower than those possible with continuous floating gate regions. The physical character of the problem of finding a useful replacement or augmenting the current approach to information processing beyond the end of scaling of CMOS is constrained by:

Size-domain: any state property employed must be sustainable and insensitive to the environment and the interface in the 1-10 nm dimension range, Energy-domain: any state change employed must have a strong energy minimum, i.e. have large barrier energies ($>>kT$ or competing processes' energy scale) to suppress probability of a disturb and yet require low enough energy so that property is useful at large densities of integration, Time-domain: the state changes must occur at time-scales that support circuit architectures with real-time use and the state property employed must have coherence times larger than computation time, Signal Sensitivity and Strength: the state property must remain relatively insensitive to the environment and be strong enough to be easily detected and recoverable in any implementation.

All possible approaches: employing properties of charge, spin, magnetic flux quantum, photon energy, polarization, entanglement, etc. and their implementation in semiconductors, magnetic materials, ferroelectric materials, ferromagnetic materials, optical materials, organic materials—molecules e.g. have limitations that arise from size, energy, time and signal strength. The dominance of charge-based approaches (and of voltage and current as signal), such as in the transistor and the memories, has its foundation in long coherence time and a high signal strength with desired time and energy scales at useful dimensions. This property holds in a variety of materials (semiconducting inorganic and organic) because of efficient transport and control of field-effect. The failure of this approach in the 1-10 nm size range arises from the loss of dominance of the transport mechanism to tunneling, the loss of reproducibility because of the loss of collective effects making the device sensitive to the environment, and the consequences of energy-time interaction whose one manifestation is power-dissipation.

The loss of collective effects through size scaling is a common change in character of all alternatives. A 5 nm×5 nm×5 nm volume can potentially hold ~10's of thousands of atoms/nuclei and electrons in a metallic system, and a larger number of bound electrons. The number of electrons potentially employable in semiconducting inorganic and organic systems is significantly smaller, even reducing to single digits in presence of classical single electron effects. Similar arguments also hold for approaches based on photons. Magnetism, ferroelectricity, and metallic conduction are examples of state properties that continue to benefit from large collective effect at the smallest scale, although inevitably these too must overcome surface and interface induced competition (paramagnetism, surface scattering, etc.).

9A and 9B show an example of bistable structures in a further floating gate embodiment.

Figure 10:
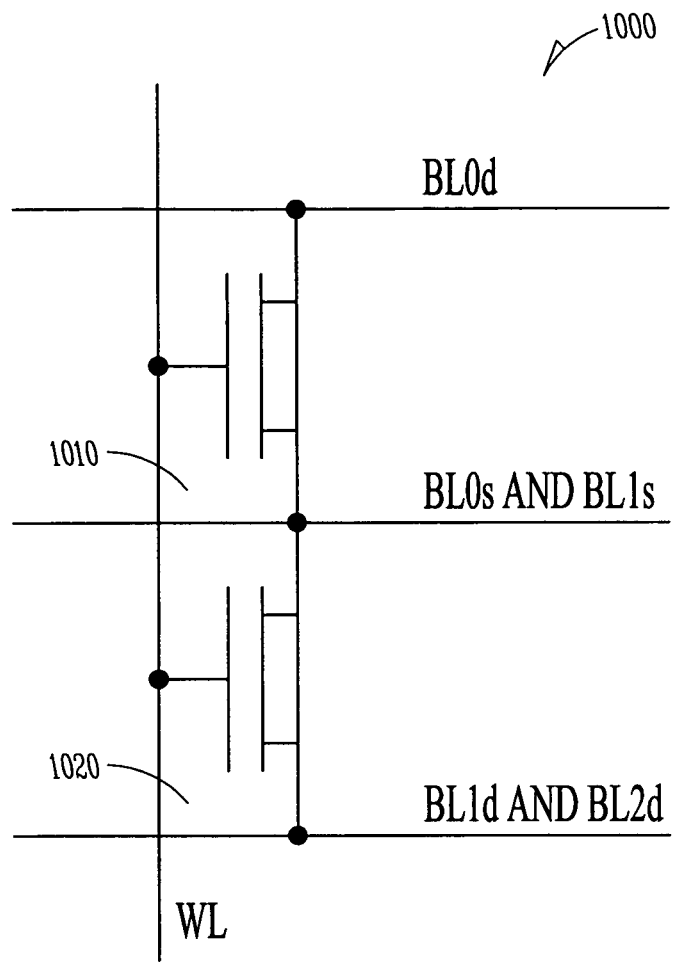

FIG. 10 shows an example memory array architecture according to an example embodiment.

FIGS. 11A, 11B, 11C, 11D, 11E and 11F illustrate electrostatic mechanical switching according to an example embodiment.

Figure 12:
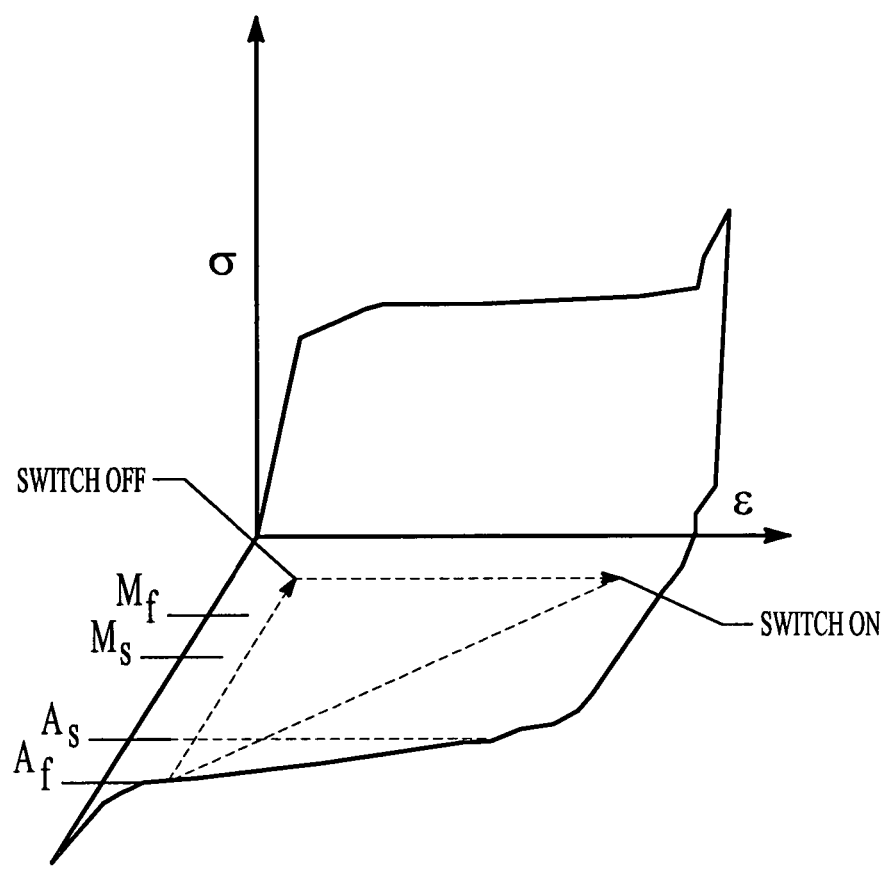

FIG. 12 is a graph illustrating a one-way effect shown in a dotted path of stress-strain-temperature characteristics after a force F is applied to a bistable structure according to an example embodiment.

Figure 13:
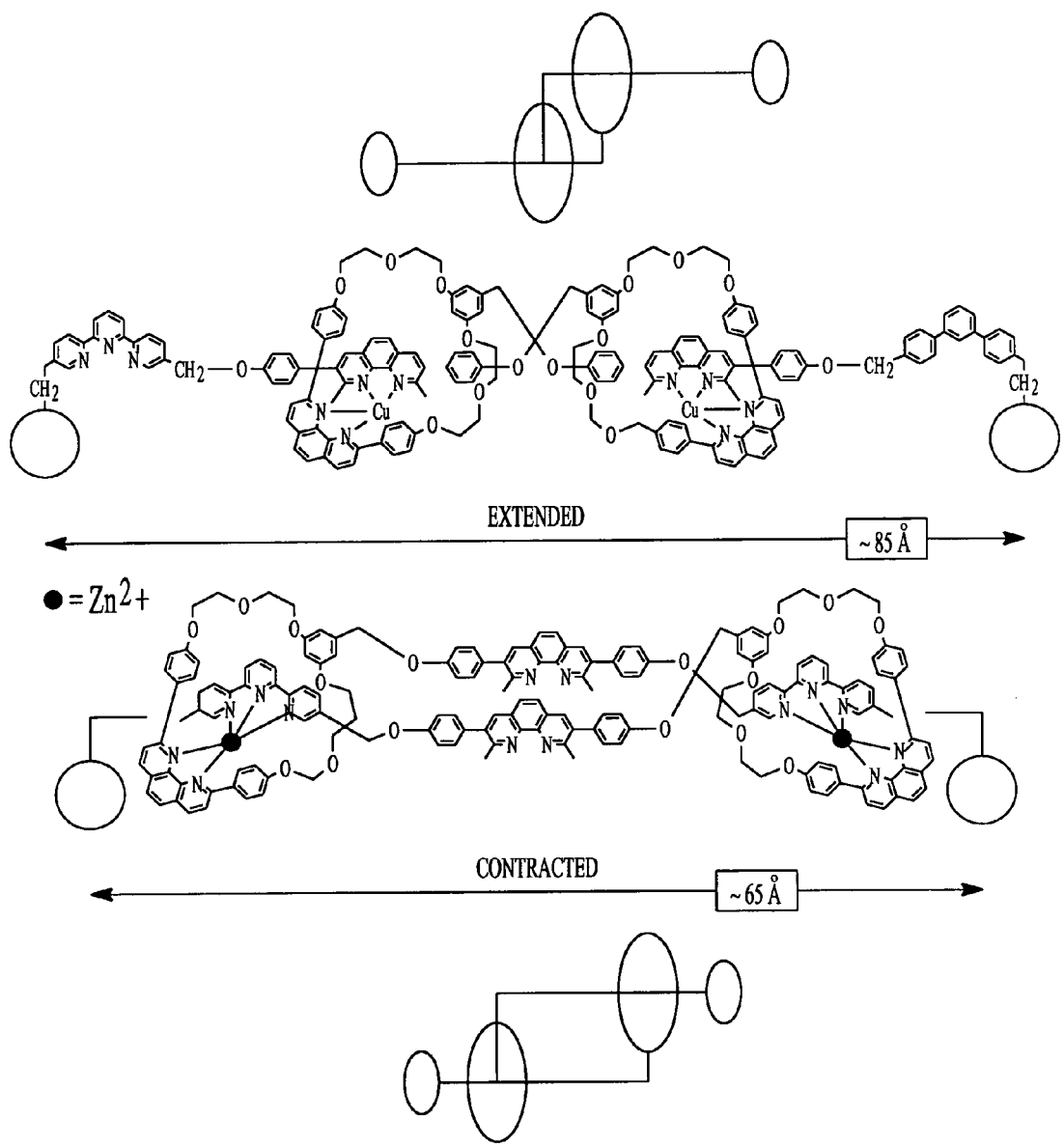

FIG. 13 illustrates a unimolecular linear array capable of length change under chemical stimulus in accordance with an example embodiment.

Figure 14:
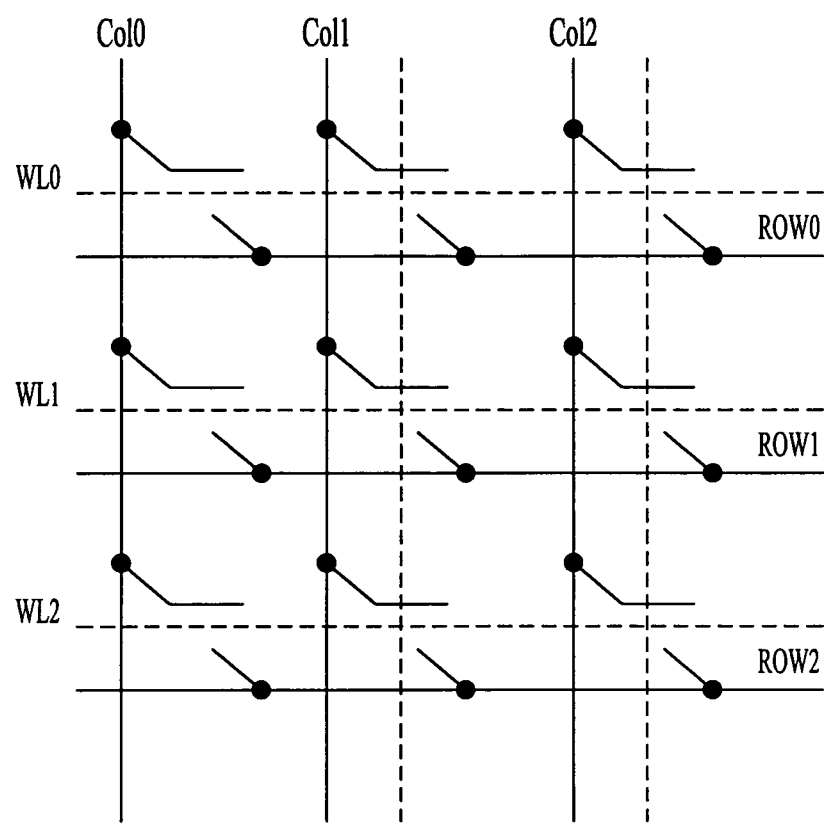

FIG. 14 shows an example cross-point architecture for an arrangement in which a memory utilizes bistable mechanical structures according to an example embodiment.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

Prior memory approaches involved the use of electrical or magnetic states of materials. None of these approaches employ mechanical means because traditionally mechanical means are harder to achieve and any significant movement requires large electrostatic voltages. The beauty of mechanical means, however, lies in their clear distinctive conductivity.

Several different embodiments using materials the retain one of at least two bistable changeable shapes in a very small nanoscale type of footprint are described in this detailed description. The materials may include memory shape metal alloys, and may be used as a gate for a field effect transistor, providing different transistor characteristics with two different gate shapes that may be electrostatically controlled. In a second embodiment, shape memory alloys are used as thermally actuated switches between the gate and channel of a transistor to provide conductivity to obviate hot-carrier degradation of charge injection for a FET. Other embodiments include the use of shape memory alloys as a highly dense cross bar or cross point switch. With writing and reading control logic, a memory device is formed.

In one embodiment, a memory device structure uses gate deformation actuated by electrostatic forces so that a transistor's characteristics undergo a reproducible change. The deformation is bistable, producing a bistable transistor characteristic that may be used as the memory. Conventional materials, at least one of which is programmed with stress may be employed in the fabrication. The characteristics can also be improved using shape alloy memory materials by taking advantage of their large elastic strain.

In further embodiments, electrostatic force is used in deforming the gate of a transistor, thus directly changing the transistor characteristics to obtain a bistable electronic device useful as a memory. Both electrostatics and at least one stressed film may be used.

The bistable property can also be employed in other arrangements where the bistable element provides a series element to a transistor and is thus accessed by the transistor to assess the memory state.

Bistable Gate Embodiments

A first embodiment includes a stressed gate stack that is deformable into two stable positions. This allows programming a non-volatile state rapidly in the device. Since deformations as small as a fraction of a nanometer can be easily sensed by transistor operation through changes in gate control characteristics and through the intrinsic gain in transistor structures, the device is extremely low power while providing density that is significantly higher than that of SRAMs at comparable speeds. Use of this deforming capability in a gate connected to a transistor channel achieves fast reliable nanoscale memory.

Small electrostatically created deformation can be utilized to produce two stable deformed states for a transistor. Less than 1 nm movement of this deformation can be sensed through the electronic properties of a transistor due to their ultrahigh sensitivity through gain. Since transistor technology can be made very reproducible, the mechanical deformation is coupled to a fast electronic sensing to provide a bistable non-volatile memory.

In one embodiment, the deformation is created through the use of a highly compressive film or film stack for the gate. When released in the region over the transistor, this gate deforms into two possible states. Each of these states can be obtained by application of a bias to a plate or to the channel through the transistor's source and drain region.

Figure 1A:
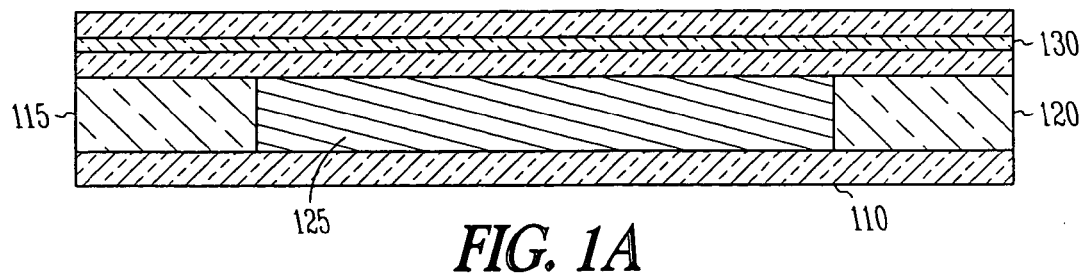
FIGS. 1A, 1B and 1C illustrate the use of mechanical effect to provide bistable positions according to an example embodiment.
Figure 1B:
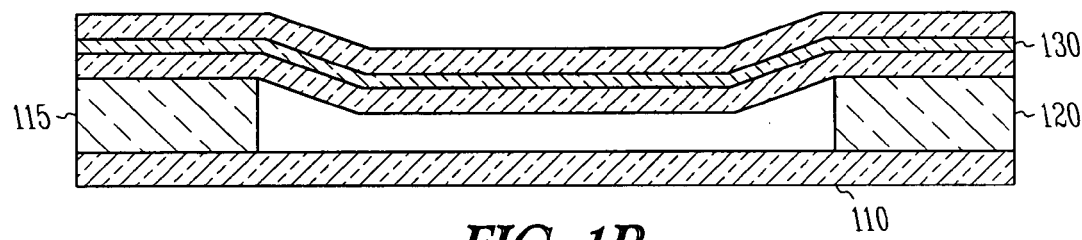
Figure 1C:
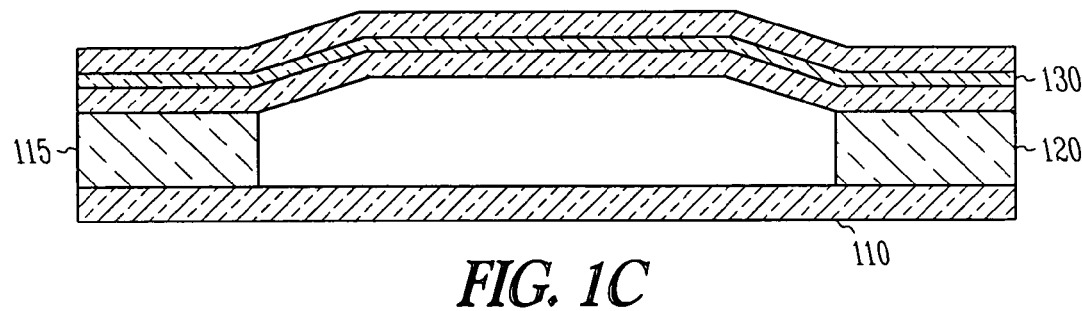

The deformation is used as an intrinsic part of transistor operation to achieve the bistability. The mechanical principle utilized in the structures is described through use of a simple example based on common semiconductor processes. FIGS. 1A, 1B and 1C illustrate the use of mechanical effect. A substrate 110 is used to support holding posts 115 and 120 and selectively removable sacrificial layer 125 (e.g., a post of oxide and selective layer of nitride) formed between the posts 115 and 120. A highly compressively stressed film 130 is deposited on top of the posts 115, 120 and sacrificial layer 125 and patterned into desired shapes for integration with circuitry. When the sacrificial layer 125 is removed, the deposited film 130 deforms either into a concave or convex shape shown respectively in FIGS. 1B and 1C because the compressive stress is released through elongation.

The deposited compressively stressed film 130 may be single material (stressed metal film, polysilicon, etc.) or a composite such as metal and polysilicon together with a stressed dielectric (such as silicon dioxide). If the underlying substrate 110 is semiconducting—like that of a transistor— and the deforming top layer 130 is used as a gate then the change in the distance between the channel and the gate in the two states provides two different operating regions of the transistor (a change in threshold voltage as also gain etc.).

Figure 2A:
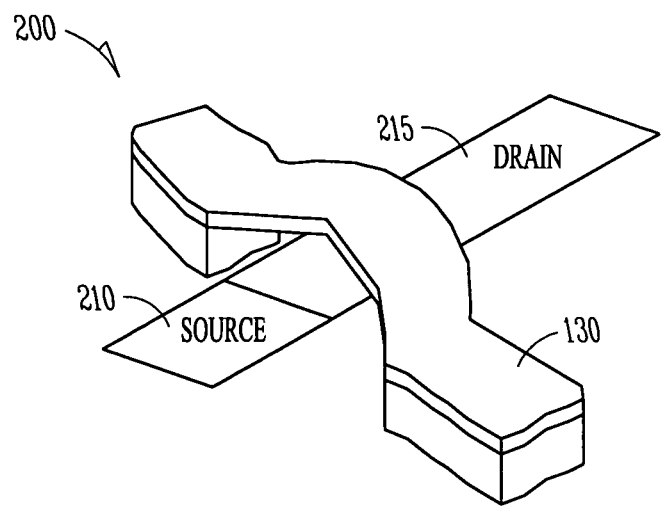
FIGS. 2A, 2B, 2C and 2D illustrate the use of mechanical effect coupled with a transistor to provide a memory device according to an example embodiment.
Figure 2B:
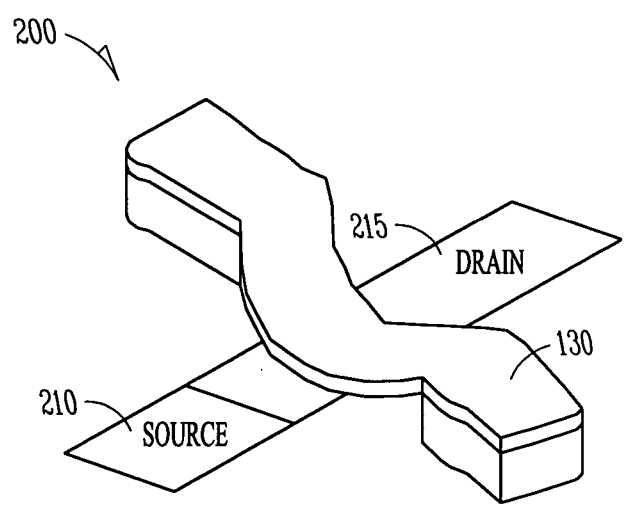

This simple principle can be quite easily applied to a transistor such as FET 200 having a source 210 and drain 215 as shown in FIGS. 2A, 2B, 2C and 2D. FIGS. 2A and 2B show the patterned stressed gate film 130 held together beyond the transistor's active region through the posts or just the isolation region of the substrate in two different positions. Exposed surfaces may have thin oxide layers, which may provide stability.

Figure 2C:
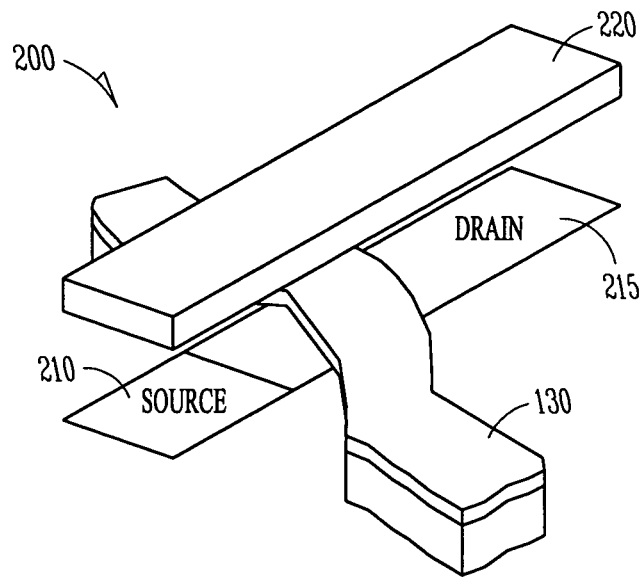
Figure 2D:
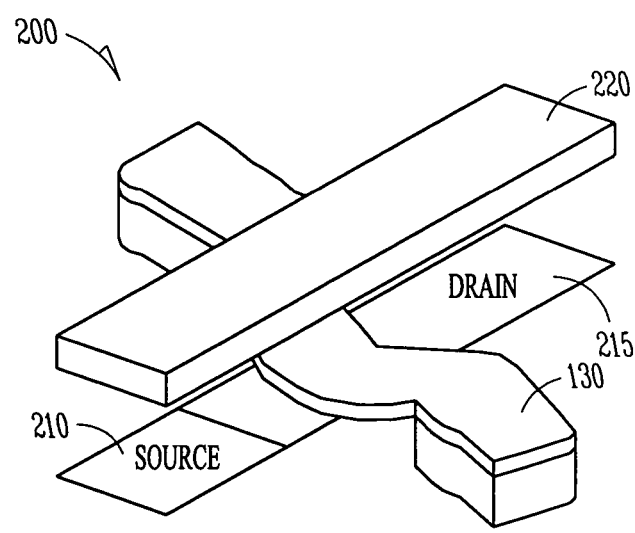

A plate line 220 runs over the top of this assembly perpendicular to the gate as shown in the different positions indicated in FIGS. 2C and 2D. The plate may have a gap between the plate and gate, which may be provided by the use of a sacrificial layer. The gate now can be deformed to either shape by application of a voltage between the gate and the plate, or the gate and the source/drain of the transistor. The voltages ma be programmed to be high, but no particle current flows and no contacts are formed. Sensing may occur through smaller voltages applied between gate, source and drain.

By applying a potential difference between the plate and gate, the gate is deformed up towards the plate as shown in FIGS. 2A and 2C. By applying a potential difference between the plate and channel (through a potential applied to drain, source or both), the gate is deformed towards the channel as shown in FIGS. 2B and 2D. Both of these conditions require large enough voltage for the deformation to occur. When smaller voltage is applied between the gate and the transistor, the transistor can be read through the current flowing from drain to source.

In some embodiments, the gate is in compressive stress. Polysilicon, metals, silicides, and other materials can be employed to achieve this. It can also be achieved through a combination of highly stressed thin dielectric film together with a gate material. Shape memory alloys can be used to achieve high elastic strain. The gate material may be a single or composite material in various embodiments.

In one embodiment, the plate line runs substantially perpendicular to the gate, and is on top of the gate line in the channel. It can be oversized. A large voltage as compared to a smaller read voltage is applied between the plate and gate to cause the gate line over the transistor to locally deform upwards. A large voltage applied between gate and source-drain of the transistor causes the gate to deform downwards. The former has a higher threshold voltage than the latter.

Figure 3A:
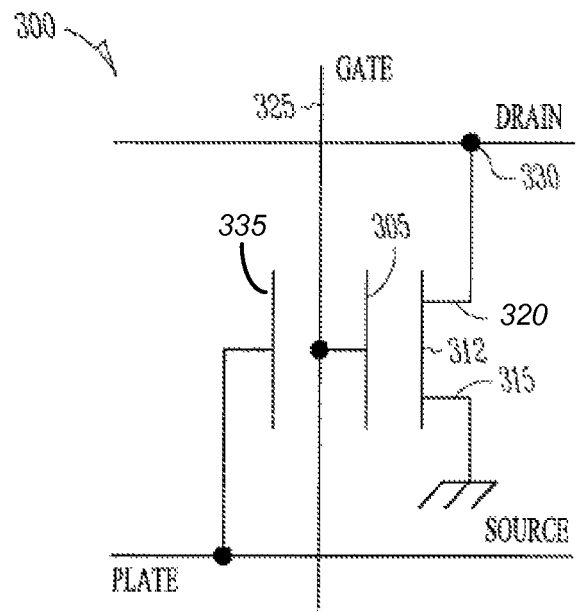
FIGS. 3A and 3B illustrate a single memory cell using deformation of a film according to an example embodiment.
Figure 3B:
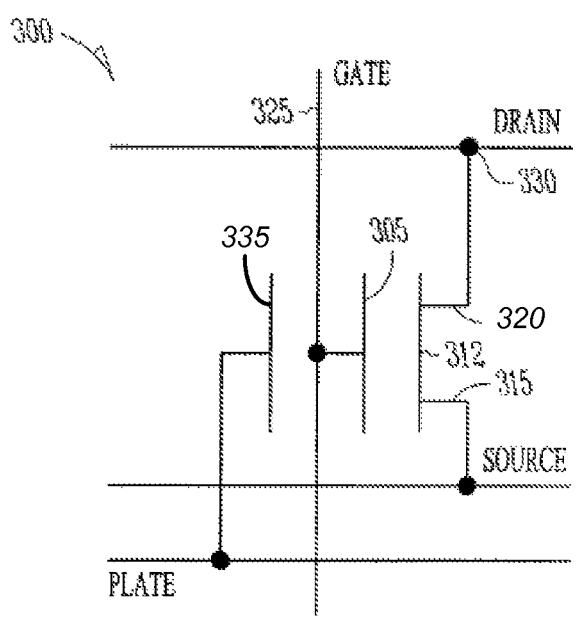

FIGS. 3A and 3B illustrate a single cell 300 using deformation of the film 305 for memory effect. A plate line 310 runs on the gate 305, and can deform over the channel 312 between the source 315 and drain 320. Three bias lines, gate 325, drain 330 and plate 335 are provided with sources either grounded or connected to another line. In one embodiment, the plate lines run perpendicular to the gate lines, and the plate lines run parallel to the drain lines.

When a voltage relatively larger than a read voltage is applied between the gate and the plate, the gate deforms toward the plate. This increases the threshold voltage of the transistor. When a voltage relatively larger than the read voltage is applied between the gate and the drain/source, the gate deforms towards the channel, thus decreasing the threshold voltage of the transistor.

The read operation on the transistor is similar to most floating gate non-volatile memories. A voltage applied to gate source and drain senses the conductivity of the transistor to asses its memory state. In one embodiment the source is grounded as shown in FIG. 3A. In a further embodiment, the source is connected individually as shown in FIG. 3B, which may provide an ability for a more dense memory array.

Random access is possible for each of the memory sites. Each deformation occurs in time constants that can be at nano-second or below. This provides a structure that is as fast as SRAM structures. The structure is highly dense because it is a single element memory and it is highly scalable and reliable since no hot carrier or other defect generating tunneling takes place. No moving parts need to touch other moving parts and hence MEMS-like reliability issues don't exist in the structure.

Note that these approaches can be applied to the various structural manifestations of transistor. They can be used with the fin-based geometries (Finfets) as well as vertical FETs.

Temperature Actuated Mechanical Memory Embodiments

In one embodiment, a memory device structure uses an entirely new concept of charge transfer and potential equilibration based on temperature-triggered mechanical movement in shape memory alloys. Shape memory materials may be used to provide two stable states in order to implement a mechanical-electrical memory. Actuation coupled to electronic gain provides a reliable and scalable memory.

In a further embodiment shape memory alloys provide clear distinctive conductivity that obviates the hot-carrier degradation of charge injection and the small effects of change in conductivity arising in phase-change effects. A number of forms that these memories provide bistability, which can also be implemented using modem processing techniques at nanoscale.

A non-volatile state can be made at room temperatures using a combination of stressed films with shape memory alloy to make a switch that is triggered by heating. A memory made in this manner may be made to function rapidly at ns time-constants. The use of shape memory alloy in conjunction with electronic transistors containing floating gates may be used to obtain fast reliable nanoscale memory.

In one embodiment, the use of shape memory effect together with an intentionally stressed layer provides two different achievable states. The structure may be employed in such a way that when hot/warm, the switch conducts, and when cool, it does not conduct.

Shape memory alloys are unique in that they possess a shape "memory." When altered in their shapes by deformation under proper conditions, shape memory alloys return to predetermined shapes when heated to an appropriate temperature range that causes phase transition. The temperature depends on the material composition. It can be room temperature and higher or lower through suitable choice of combinations. Common examples of shape memory alloys are Ti—Ni alloys where transformation occurs between Austenite and Martensite phase, CuZn, CoCrMo, AuCd where it was first discovered, etc. NiTi alloys, and some of the other shape memory materials can be reasonably compatible with silicon processing technology.

Large shape deformation is made possible by shape memory alloys. A 10% elastic strain allows a significant movement even at small dimensions that can be utilized for electron flow and sensing and detection.

FIGS. 4 and 5 illustrate simple example based on common semiconductor processes. The figures illustrate using effects that occur as a result of presence of compressive or tensile films together with a shape memory alloy structure.

In FIGS. 4A, 4B, 4C, 4D and 4F, formation of a side-wall (such as that of a transistor) is illustrated. Using a sacrificial pattern 410 (which maybe conventional semiconductor material of silicon, or oxide or nitride, but chosen so that it can be selectively removed) supported on a substrate 415, a vertical side-wall 420 is formed of a compressive or tensile material. Silicon dioxide or silicon nitride are two examples of this. A shape memory alloy 425 is then also formed as a sidewall and annealed. Now if the sacrificial pattern 1 is removed, the side-wall structure instead of standing up straight will shift shape. If the sidewall film was tensile, it wants to contract and will form the shape shown in FIG. 4D, i.e. will pull in. On the other hand, if the sidewall was a compressive film, it will want to stretch out and will result in the form shown in FIG. 4E.

Figure 4A:
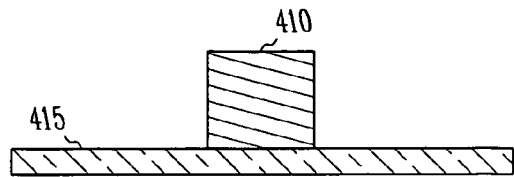
FIGS. 4A, 4B, 4C, 4D and 4F illustrate a memory device using a side-wall having bistable positions according to an example embodiment.
Figure 4B:
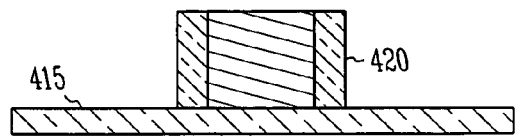
Figure 4C:
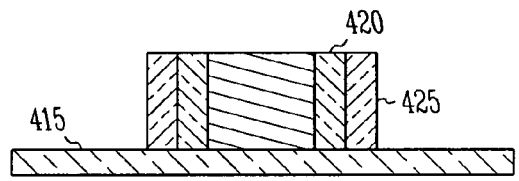
Figure 4D:
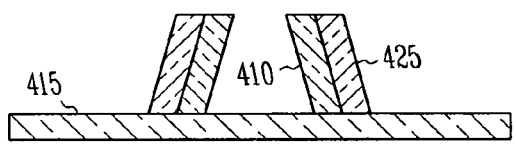
Figure 4E:
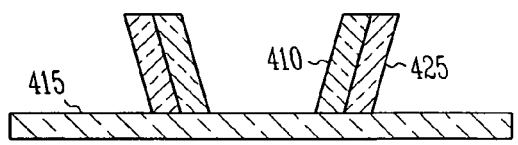
Figure 4F:
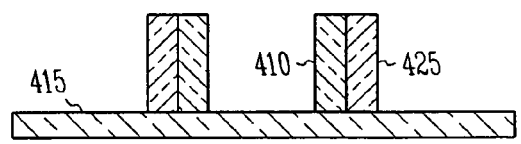

Because of the presence of the shape-memory alloy, upon warming up above the transition temperature, the structure will return to the original form sans the sacrificial pattern as shown in FIG. 4F. This movement of the wall in between two positions depending on the stress of the sidewall film that is integrated with the shape memory alloy forms the basis of some embodiments of a the temperature actuated mechanical switch.

Figure 5A:
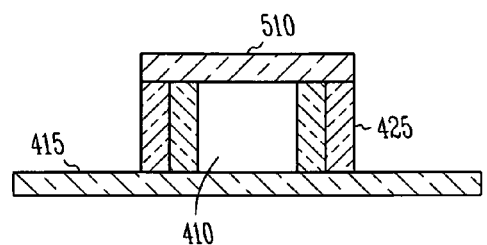
FIGS. 5A, 5B, 5C, and 5D show a memory device using a side-wall with a cap according to an example embodiment.
Figure 5B:
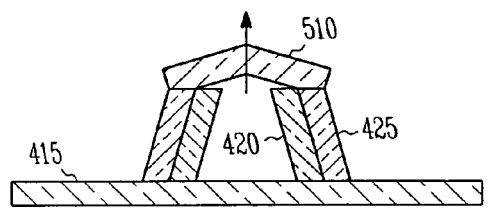
Figure 5C:
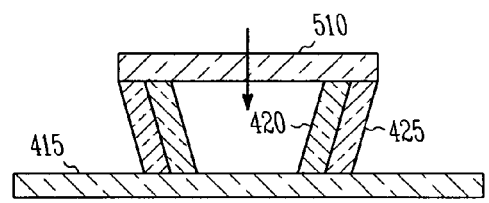
Figure 5D:
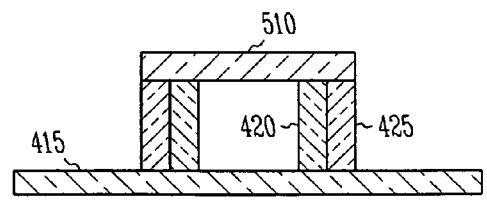

FIGS. 5A, 5B, 5C, and 5D show this same example where the shape memory alloy also forms a cap layer 510 on top of the sacrificial structure 410 (which usually will be slightly convex because of erosion at corners). In this case, if the sidewall layer is tensile, the cap will pop up as shown in FIG. 5B and will pull back if the side-wall layer is compressive as shown in FIG. 5C. Therefore the top shape memory alloy layer moves up and down. The original structure is recovered as shown in FIG. 5D when warmed up even in the absence of the sacrificial layer or structure 410 because of the memory effect and high elastic strain of shape memory alloys.

One of the fastest ways of sensing a state is usually through electronic means since transistors are fast and carriers move rapidly. To make a memory fast, one of the fastest ways of sensing the memory is through the change in current or conductivity of the transistor, i.e., similar to a non-volatile flash memory employing floating gates whose read operation is very rapid-similar to transistor speeds. The issue with non-volatile flash memories is that the charge conduction to and from the floating gate causes defect generation, is a relatively slower process, and has related dimensional constraints.

The shape memory alloy switch can be used to avoid the need of tunneling-based charge injection into the floating gate and replace it with mechanical movement that provides low resistance charge conduction.

Figure 6A:
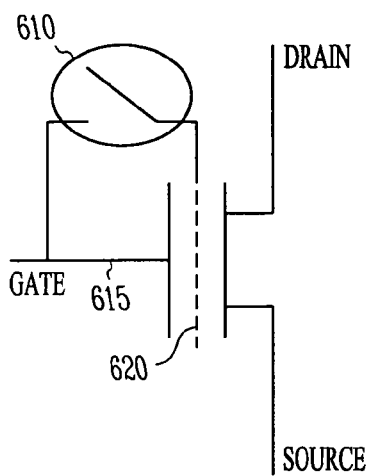
FIGS. 6A and 6B illustrate a temperature triggered shape memory switch according to an example embodiment.
Figure 6B:
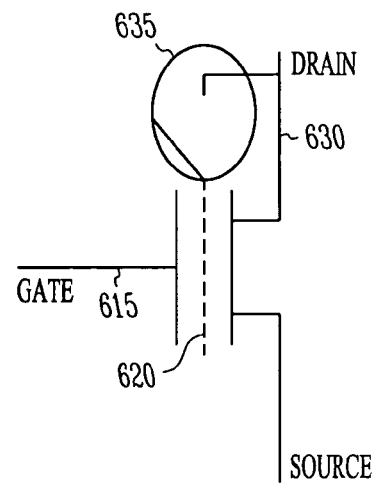

For a floating gate structure, where the floating gate exists between the gate and the channel of a transistor, two examples of the placement of the switch are shown in FIGS. 6A and 6B. In FIG. 6A, a temperature triggered shape memory switch 610 is placed between a gate 615 and a floating gate 620. When switch 610 is turned on (i.e. by placing the transistor in a high current and high voltage state where the temperature rise occurs), the gate potential and the floating gate potential equilibrate by transfer of charge. When the switch 610 is now turned off by removing the biases to the memory, the floating gate still maintains the charge state that it was driven to in the previous step. If the transistor was heated (and consider n-channel for this example) by applying a large gate voltage, and a large gate-to-source voltage above threshold, and an appropriate drain voltage so that a large current multiplied by drain-to-source voltage results, then the potential transferred to the gate is high. So the transistor is now in a higher conducting (i.e. lower threshold voltage state). The transistor could also have been heated by applying a low gate voltage, but substantially lower (negative) source and drain voltage. In this case the current times drain-to-source voltage causes power dissipation that leads to transfer of a low gate voltage to the floating gate. Removing the bias now results in a memory which is less conducting and equivalent has a higher threshold voltage. So both states can be programmed through electromechanical action in this structure and the trick is to find a compact way of achieving it.

Biases are also applied to drain 630, so it is also possible to transfer a potential to the floating gate from drain as illustrated by placement of switch 635 in FIG. 6B. This is achieved by suitable choice of drain voltage that needs to be transferred while warming up the transistor through the passage of current that results from applying of gate bias and drain-to-source bias. Two different potentials may be programmed into the drain 630 by the temperature triggered turning on of the switch. If drain 630 is at a lower voltage when power dissipation causes the shape memory switch to turn on, the potential transferred is low (transistor in lower conduction state). If the drain is at a higher voltage during the shape memory switch turn on, the potential transferred is high and the transistor is in a higher conduction state.

The above two examples in FIGS. 6A and 6B provide the write operation for "0" and "1" state of the memory. By reading using low gate voltage and low drain voltage, so that the temperature of the transistor is maintained low, the structure provides low disturb reading of these programmed "0" and "1" states.

Figure 7A:
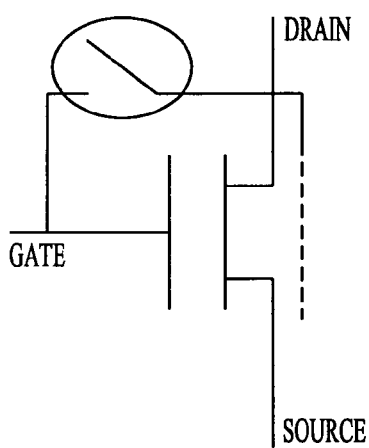
FIGS. 7A and 7B illustrate the use of floating gates on the back of a transistor channel in conjunction with a bistable structure according to an example embodiment.
Figure 7B:
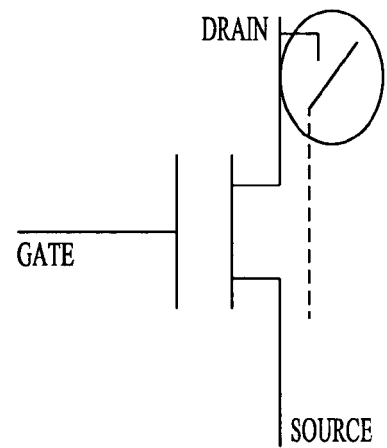

Floating gates as used in the above examples have also been formed on the back of a transistor channel such in silicon-on-insulator geometry. One advantage of this arrangement is that the top-gate now can be scaled in insulator thickness significantly better and superior electrostatics is achieved allowing for better scaling. We show this arrangement in FIGS. 7A and 7B.

These figures are drawn with the normal position of switch open, though closed is also possible. As a result of turning on of the transistor under conditions of higher current×voltage, the transistor warms up and triggers the switch to on-position. The resulting action causes a change that is maintained when the lowering of temperature returns the switch to off position. Since usually the gate and drain have voltages (low and high) applied to them, the most logical use of the shape memory alloy switch is to connect to the gate or drain. Examples are shown with the flowing gate on the back of the transistor channel.

Note that in both of the cases of FIGS. 6A, 6B, and 7A, 7B, the transistor is being placed in different states of conduction; a positive voltage transfers causes higher conductivity than in the absence of the transfer. Negative potentials can also be transferred. This could be done through either appropriate biasing of the gate or drain, while keeping gate-to-drain, gate-to-source, and drain-to-source potential differences identical (i.e., a shift in potentials) during the write operation.

In all these examples the reading of the device is performed at lower voltages and currents, and hence lower power dissipation conditions. This allows the temperature of the structure to be kept low without triggering the shape memory transition.

Figure 8A:
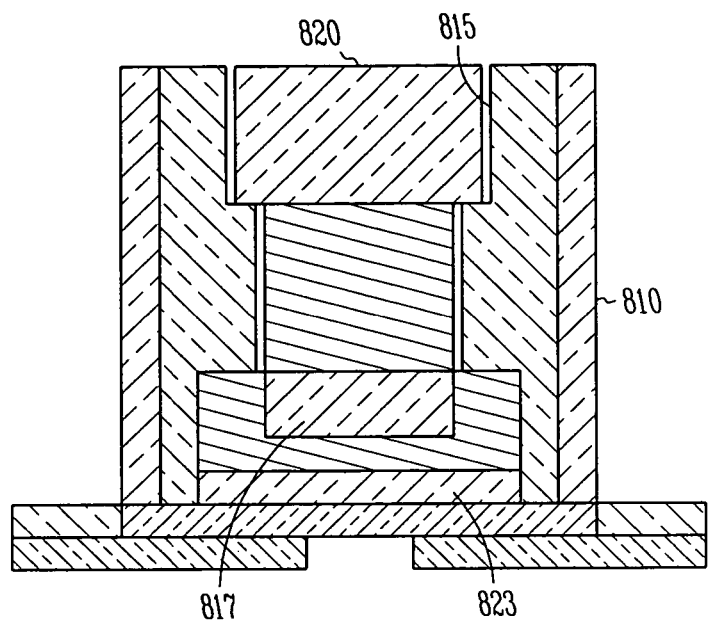
FIGS. 8A, 8B, 8C, 8D, 8E, 8F show examples of bistable structures with planar transistors according to an example embodiment.
Figure 8B:
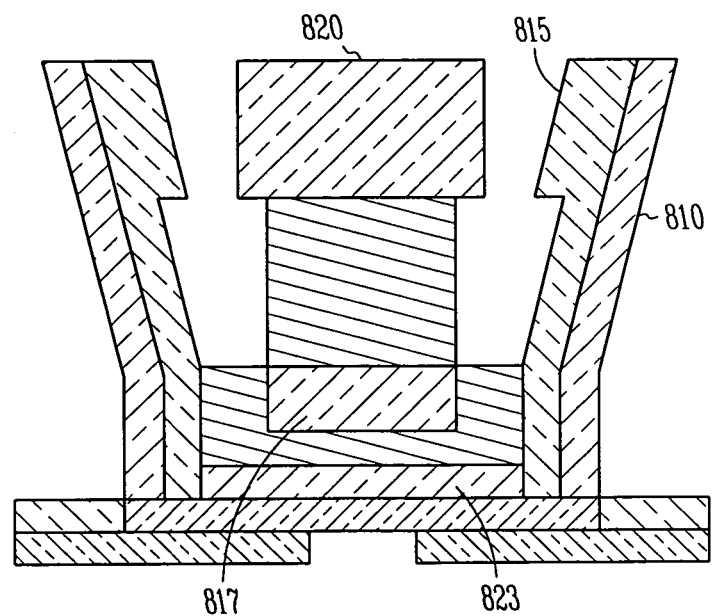
Figure 8C:
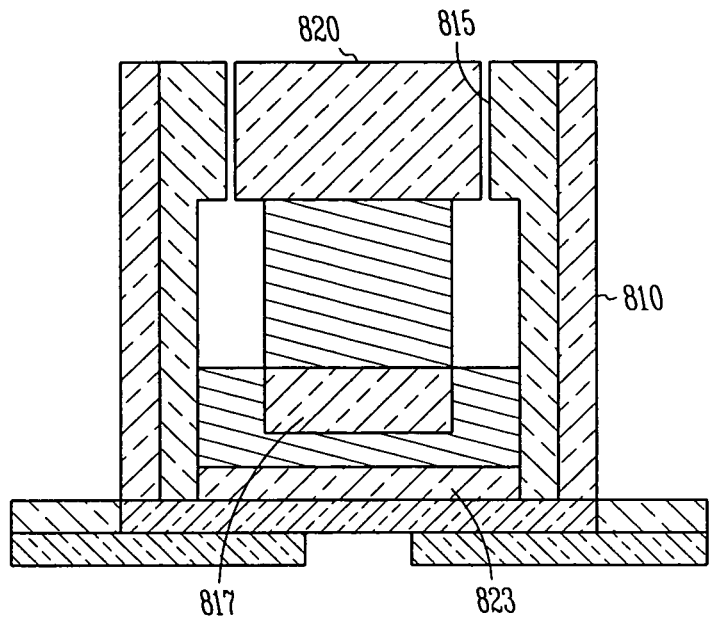
Figure 8D:
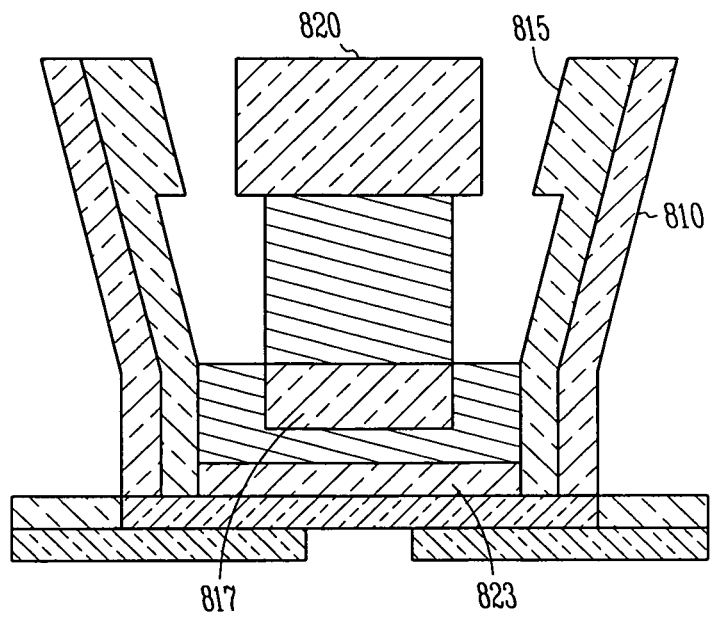
Figure 8E:
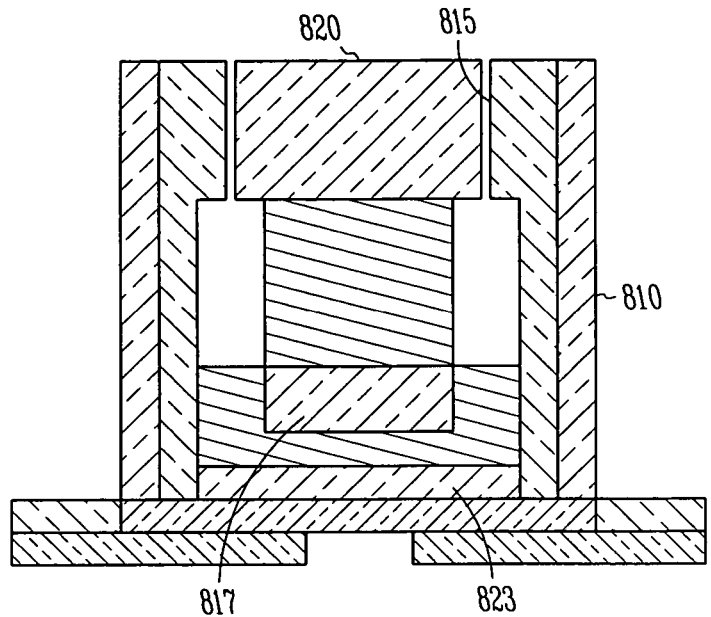
Figure 8F:
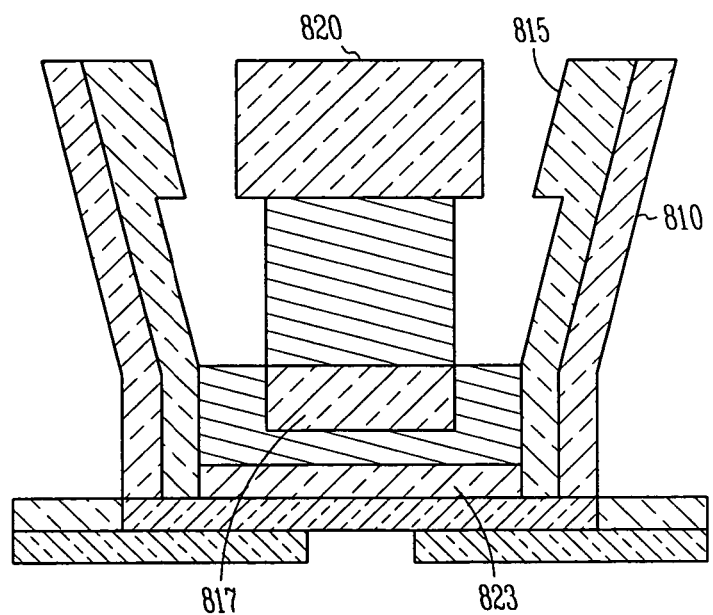
Figure 9A:
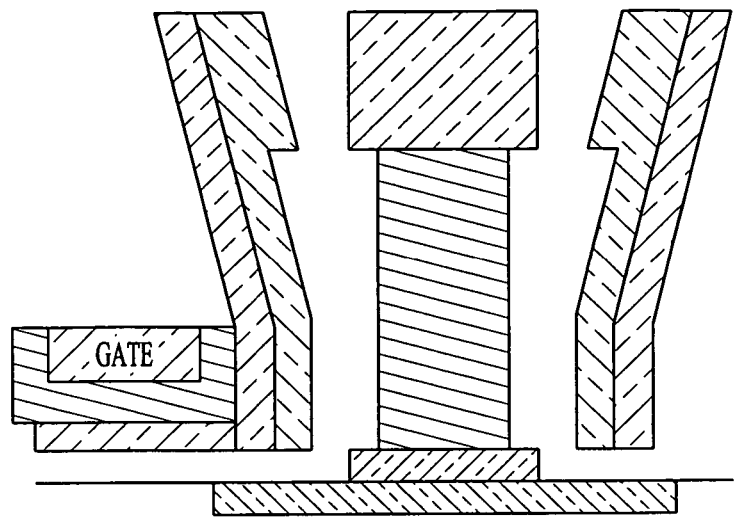
Figure 9B:
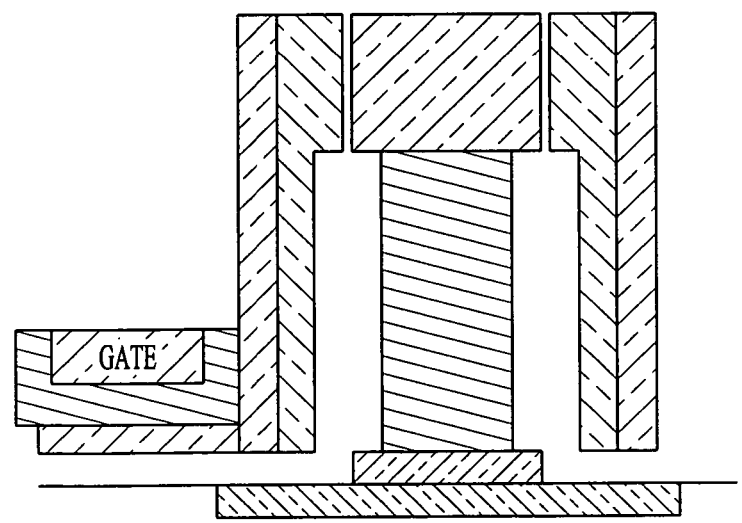

FIGS. 8A, 8B, 8C, 8D, 8E, 8F and 9A and 9B show examples of implementation with planar transistors. FIGS. 8A, 8B, 8C, 8D, 8E, 8F show the example of gate connecting to floating gate and FIGS. 9A and 9B show an example of the drain connecting to floating gate.

In FIGS. 8A, 8B, 8C, 8D, 8E, 8F, as an example, a tensile side-wall 810 is formed on the outside of the shape memory alloy sidewall 815 that connects to the gate 817 through a vertical stack 820. When the sacrificial binding layer is removed, the shape memory switch pulls off as shown in FIG. 8B because of the tensile stress programmed in the side-wall. Reading of this switch is accomplished through low voltages and currents so that the switch is not disturbed.

The shape memory structure is integrated into the field-effect transistor with a floating gate 823. The gate itself or an extended structure is connected/disconnected using the shape memory alloy. When the transistor is hot using high VG (low S/D voltage), the floating gate 823 acquires a higher potential and the transistor acquires a low VT. If the transistor is hot using low VG (but S/D biased for similar excess drive as previous writing), the floating gate structure acquires a low potential and the transistor has a high VT. This is the state preferred for the erased state of the device.

In FIG. 8A, an atomic separation layer is shown between the gate stack 820 and tensile side walls 815. In FIG. 8C, a high VG turn-on of the transistor leads to higher temperature and transfer of VG to the floating layer. Upon remove of the bias voltage as illustrated in FIG. 8D, the transistor is in a low threshold voltage state. In FIG. 8E, low VG turn-on of the transistor with S/D biasing, leads to higher temperature and transfer of VG to the floating layer. Upon removal of the bias voltage in FIG. 8F, the transistor is in a high threshold voltage state.

FIGS. 9A and 9B show an example where the drain plug is connected and disconnected from the floating gate. The principle of the operation this connection and disconnection is similar to that of the gate-floating gate connection.

FIG. 10 shows an example architecture implementation 1000 where each individual element 1010 and 1020 can be accessed through application of gate, source and drain bias voltage. Biasing for programming of the memory, such as writing, erasing and reading can be achieved through suitable choice of voltages applied across lines. The memory may also have a common source.

Note that these approaches can be applied to the various structural manifestations of transistor. They can be used with the fin-based geometries (Finfets) as well as vertical FETs.

Cross-Point, Cross-Bar Electrostatic Mechanical Memory Embodiments

Continuation of the use of collective effects is central to reproducibility and to achieving devices that can augment (or perhaps replace) current approaches of electronics. With this central principle, non-volatile memories are described that operate in nanoseconds and can be scaled down to 5 nm dimensions and lower. The memories operate by providing open and short conditions and provide a very straightforward way of achieving a highly dense cross-bar switch with electronic periphery circuitry for writing and reading and control logic. The memory provides a straightforward means for exploiting mechanical properties coupled with conduction to harness collective effects in an electronic environment while achieving useful size, energy, time, and signal properties.

In one embodiment, the cross-point switch employs movement achieved by electrostatic attraction, stability achieved by use of interface force to keep the switch contacted, and opening of the switch achieved by flow of a larger current that overcomes the interface force to revert to its as-formed off-state condition. The arm of the switch can be made of a variety of materials. One attractive option is use of shape memory alloys. These materials can have elastic strain up to 10%. Further materials include bimetals, organics, nanotubes and other materials that can be actuated by use of electrostatic force.

A variety of such materials may be used to form a cross-point switch that can be set by electrostatic force, read by flow of small current for open or short condition (memory state), and reset by flow of higher current to open condition.

Because of open and short as the two conditions of use, the cross-point switch in a cross-bar arrangement has no disturb problems that are commonly seen in cross-bar arrangements.

In one embodiment, a mechanical switch may be implemented at cross-point, actuated through gates and reset through either gates or passing of larger current. A non-volatile state can be made at room temperatures and the memory made to function rapidly at ns time-constants.

Figure 11A:
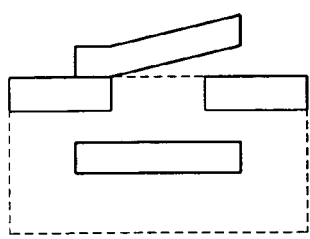
Figure 11B:
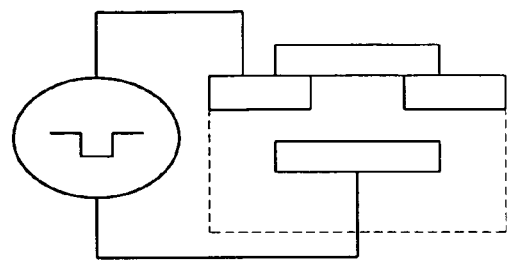

Some examples of electrostatic mechanical switching are illustrated in FIGS. 11A, 11B, 11C, 11D, 11E and 11F. These all rely on the mechanical movement of a conducting arm to establish or break a conducting contact. In a normal state of the switch is off as illustrated in FIG. 11A. A second quasi-stable on-state in FIG. 11B results from van der Waals interaction. The second state is accomplished through the application of a bias voltage which attracts the arm and closes the switch. The FIG. 11A off state is a stable state as assembled of the structure, while the on state in FIG. 11B is achieved with strain in the arm, but is a quasi-stable state because the attractive forces of the contact interface are stronger than any restoring forces. To revert to the off state, FIG. 11A, utilizes a method of release that is compatible with this simple geometry.

If a conducting shape memory alloy is used for the arm, a large current density, though small current at nanoscale levels, causes the arm to warm up and phase transformation leads to overcoming of the attractive force that kept the switch on. Nitinol (Ti—Ni alloy) going through the martensite to austenite transformation provides one possible practical implementation of this with a strain of as high as 10% sustainable in the structures. Note that it is not necessary that the arm be made of shape memory alloy. A conducting material whose van der Waals attraction can be overcome by warming and passing of current (factors of few higher than the read current) is sufficient. Doped polysilicon, metals, bimetal strips, conducting organics are all options.

Figure 11C:
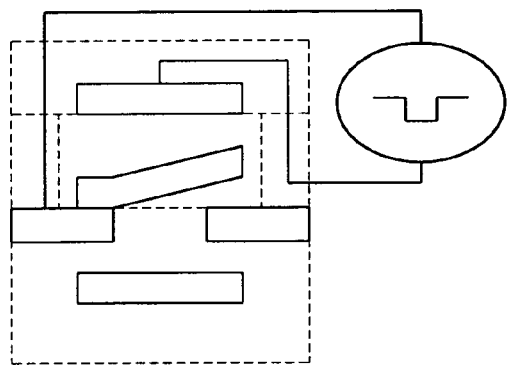
Figure 11D:
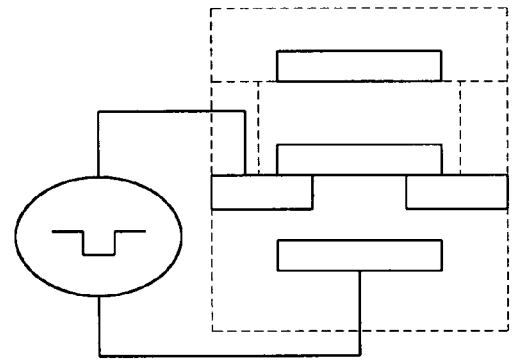

In FIGS. 11C and 11D the two states occur through electrostatic attraction resulting from bias at the plates on top and bottom. In the implementations of FIGS. 11C and 11D, conducting polymers (polyanilines, and other molecules that have been demonstrated) may be used, as well as flexible nanotubes to provide the attractive forces through a gate the allows the formation of the conducting channel between the two electrodes.

Underlying the behavior of these switches is the property of achieving significant displacement either in the transverse direction or the longitudinal direction, a displacement sufficient to suppress any tunneling current by many orders of magnitude and making the switch extremely low current or zero current (hence off) in the disconnected state. In order to accomplish this reproducibly, with low leakage currents, displacement exceeding 1 nm is necessary to limit tunneling. To make the device a nanoscale alternative, the on-surface dimensional scale may be limited to 10 nm or below. Shape memory alloys, conducting molecules and polymers, shape-changing conducting supramolecular assemblies, bimetals or larger metals with thermal expansion changes, and carbon nanotubes, are all potential candidates to achieve these. The following is a discussion of their properties and how they can be applied.

Shape memory alloys derive their ability to sustain large strain (hence change in shape) and a temperature-mediated change through phase transformation. In TiNi alloys, this mechanism is based on reversible martensitic transformation between a high temperature austenitic phase and a low temperature martensitic phase with the transformation in the 100-200C range occurring well below melting temperatures. These properties make the "one-way effect" possible. In the one-way effect shown in the dotted path of stress-strain-temperature characteristics shown in FIG. 12, after a force F is applied, the deformation is permanent, a seemingly plastic deformation. In one embodiment, this would be contact position or switch on state achieved by application of electrostatic force. Upon heating, the plastic deformation recedes completely and the switch recovers to its former state. In one embodiment, this would be the as-formed state (switch off) and can be achieved by passing a larger current that heats the shape memory alloy. Because of the small cross-section, the currents required for this heating are small. If the arm of our switch is 10 nm long, a displacement of 1 to 2 nm through bending can be achieved with small strain (well below 4%) and quite within the capabilities of many of the shape memory alloys as well as other materials and their combinations.

The implementation of the switch form shown in FIGS. 11C and 11D, although complex, lends itself to self-alignment where a single high resolution dimension can be transferred in the vertical direction. Because electrostatic forces are employed to move the arm between the off and the on position, the structure has the advantage of permitting a wider variety of materials to be employed for the switch arm: metals, doped poly-silicon, conducting polymers, etc.

Figure 11E:
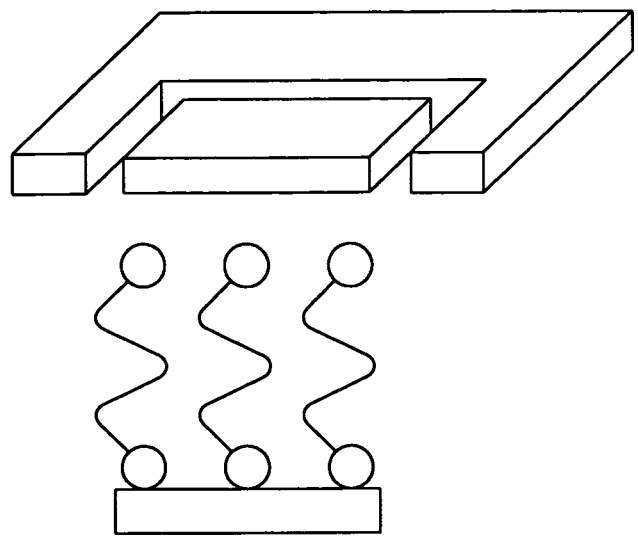
Figure 11F:
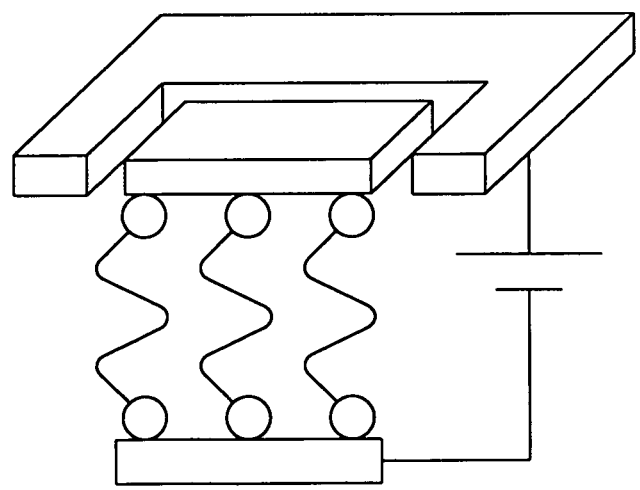

FIGS. 11E and 11F summarize an arrangement requiring self-assembly of fabrication and molecular synthesis. A number of compounds that undergo transformational changes have been proposed and are being actively studied by the supramolecular chemistry community via synthesis and modeling. A number of such compounds may be of interested due to their large displacement changes which can be attractively employed in a collective assembly that is not prone to device-to-device variations. A unimolecular linear array such as that illustrated in FIG. 13 has been modeled to be capable of ~27% length change under chemical stimulus. In particular, catenanes and rotaxanes provide the foundation for reversible contraction and stretching of a molecular assembly, similar to that of biological muscles. The molecular arrangement's flexibility through the movement of the ring lends itself to possibilities of electrostatic stretching and contraction while being self-assembled in monolayers on surfaces. With van der Waals energy in the ~1 eV range, it would be extremely interesting to explore the potential of such large dimensional change at voltages and length scales that are quite compatible with the needs of electronics. These and other yet to be discovered materials may be used.

The simplest form of implementation of this on/off arrangement through electrostatic attraction is to employ conducting grown nanotubes where the nantubes straighten to connect the electrodes. The extremities of the molecules and the nanotubes are functionalized with conducting metallic ends. Thiol groups are one example of such ends. Assemblies of such free standing flexible nanotubes can be stretched to make the contact. These structures which are simple on off switch, with different mechanisms for resetting, can be used in cross-point architectures in a very straightforward way that allows tremendous advantages of packing density, scaling, and self-assembly.

FIG. 14 shows an example cross-point architecture for an arrangement in which a memory is reset to off position by passing a larger current. In this array, each intersection is independently addressable. Note that as suggested in FIGS. 11A-11F, the Word Lines (WL0, WL1, WL2, . . . ) are the gate lines running that apply the electrostatic potential. The column lines (Col0, Col1, Col2, . . . ) and the row lines (Row0, Row1, Row2, . . . ) run orthogonally with the switch formed at their intersection. In order to short a switch. The intersecting word line is turned on high with respect to the column line. Only one such switch exists and it will set, and turn on. To turn this switch off, current is passed between the column and the row (i.e., by driving by current or voltage the switch at the intersection of the appropriate column and row). No other switch carries this current. So, only the intersection switch is reset. To read, a small current is passed through the column line and read from the row line. This reads the switch bit at the intersection of these lines.

Note that because the switches are off (ultra-low current) or on (shorts), there are no disturb problems in reading, writing or erasing. This is a unique property that makes this cross-point arrangement reproducible. The other geometries shown in Figures, also lend themselves to similar arrangements. For the two gate arrangements, two lines may be run to flip the setting of the arm of the switch. This arrangement is very general, and allows a variety of combinations of materials to be combined (shape memory alloys, bimetals, conducting organics, shape changing molecules, nanotubes) to form the switch and cross-point arrangement to access them.

The structure can be formed on insulators, and connected to silicon electronics in order to write, read, erase, and for control logic. It is potentially very dense since it lends itself naturally to three-dimensional integration arrangements where electronics is below and the switch structures are integrated above in multiple planes.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

The invention claimed is:

1. A memory device comprising:
    a transistor having a channel, a drain and a source; and
    a bistable nanoscale structure coupled to the transistor to form a gate of the transistor over the channel, the gate including a deformable gate portion having two stable positions relative to the channel to provide different operating regions of the transistor, wherein the bistable nanoscale structure is structured to allow the deformable gate portion to be in the two stable positions without contacting other parts of the device that do not support the deformable gate portion.

2. The memory device of claim 1 wherein the bistable nanoscale structure has two stable positions that differently affect the conductivity of the transistor.

3. The memory device of claim 2 and further comprising circuitry coupled to the nanoscale structure to change the nanoscale structure between the two stable positions.

4. The memory device of claim 3 wherein the circuitry thermally or electrostatically changes the nanoscale structure between the two stable positions.

5. The memory device of claim 1 wherein the bistable nanoscale structure comprises a conductor formed under stress between two supports and actuatable to different stable shapes which relieve the stress.

6. The memory device of claim 5 wherein the two different shapes comprise a bowed up shape and a bowed down shape.

7. The memory device of claim 6 wherein the gate deforms in shape to two stable states over a channel region of the transistor.

8. The memory device of claim 6 and further comprising a plate electrode for deforming the gate by application of a potential between the plate electrode and the gate.

9. The memory device of claim 1 wherein the bistable nanostructure comprises a stressed polysilicon film, a stressed metal film, a stressed polysilicon film with a silicide on top, or a stressed polysilicon film with metal on top.

10. A memory device comprising:
    a transistor having a channel, a drain, a source, and a gate formed over the channel, the gate including a deformable segment that has two stable deformed states corresponding to different stable positions relative to the channel without contacting other parts of the memory device that do not support the deformable segment to form a single transistor memory element that has two memory states corresponding to the two stable deformed states; and means for changing the state of the transistor by moving the deformable segment between the two stable deformed states.

11. A transistor based memory device comprising:
a memory array having memory sites, wherein each memory site includes:
a stressed gate including a deformable segment having two stable positions and operable to switch between the two stable positions without having the deformable segment contact other parts of the device that do not support the deformable segment;
means for moving the gate to the two stable positions; and
a channel proximate the gate such that channel electrical characteristics are a function of the position of the gate.

12. The memory device of claim 10 wherein the deformable segment of the gate includes a deformable conductor formed under stress between two supports and actuatable to different stable shapes.

13. The memory device of claim 10 wherein the means for changing the state of the transistor includes a circuit that controls a voltage applied relative to the gate.

14. The memory device of claim 10, wherein the means for changing the state of the transistor includes a circuit that controls a voltage applied relative to a drain or source of the transistor.

15. The memory device of claim 10 wherein means for changing the state of the transistor includes a circuit that electrostatically changes the deformable segment of the gate between the two stable positions.

16. The memory device of claim 10 wherein the deformable segment of the gate includes a stressed polysilicon film, a stressed metal film, a stressed polysilicon film with a silicide on top, or a stressed polysilicon film with metal on top.

17. The memory device of claim 11 wherein the deformable segment of the gate includes a deformable conductor formed under stress between two supports and actuatable to different stable shapes.

18. The memory device of claim 11 wherein the means for controllably moving the gate includes a circuit that controls a voltage applied relative to the gate.

19. The memory device of claim 11, wherein the means for controllably moving the gate includes a circuit that controls a voltage applied relative to a drain or source of the transistor.

20. The memory device of claim 11 wherein means for controllably moving the gate includes a circuit that electrostatically changes the deformable segment of the gate between the two stable positions.

21. The memory device of claim 11 wherein the deformable segment of the gate includes a stressed polysilicon film, a stressed metal film, a stressed polysilicon film with a silicide on top, or a stressed polysilicon film with metal on top.

22. The memory device as in claim 1, comprising:
a plate line formed over and separated from the deformable gate portion; and
a circuit coupled to apply a voltage between the plate line and the deformable gate to control the deformable gate portion to be one of the two stable positions.

23. The memory device as in claim 10, comprising:
a plate line formed over and separated from the deformable segment of the gate; and
wherein the means for changing the state of the transistor includes a circuit coupled to apply a voltage between the plate line and the deformable segment to control the deformable segment to be one of the two stable deformed states.

24. The memory device as in claim 11, comprising:
a plate line formed over and separated from the deformable segment of the gate; and
wherein the means for controllably moving the gate includes a circuit coupled to apply a voltage between the plate line and the deformable segment to control the deformable segment to be one of the two stable positions.

* * * * *